United States Patent
Kunida

(10) Patent No.: US 9,692,330 B2
(45) Date of Patent: Jun. 27, 2017

(54) MOTOR DRIVING DEVICE

(71) Applicant: Rohm Co., Ltd., Kyoto (JP)

(72) Inventor: Yuji Kunida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 107 days.

(21) Appl. No.: 14/721,128

(22) Filed: May 26, 2015

(65) Prior Publication Data

US 2015/0349693 A1   Dec. 3, 2015

(30) Foreign Application Priority Data

May 30, 2014 (JP) ................. 2014-112087

(51) Int. Cl.
*H02P 23/20* (2016.01)
*H02P 6/182* (2016.01)
*G01R 23/00* (2006.01)

(52) U.S. Cl.
CPC .............. *H02P 6/182* (2013.01); *G01R 23/00* (2013.01)

(58) Field of Classification Search
CPC .......... H02P 29/0005; H02P 6/18; H02P 7/00; H02K 11/0073
USPC ........................................................ 388/911
See application file for complete search history.

(56) References Cited

U.S. PATENT DOCUMENTS

| | | | | |
|---|---|---|---|---|
| 3,828,234 A * | 8/1974 | Goldberg | ........... | H01B 13/0023 388/820 |
| 4,167,000 A * | 9/1979 | Bernard | ................ | E21B 47/182 367/84 |
| 4,224,558 A * | 9/1980 | Hays | ....................... | H02P 25/30 318/592 |
| 6,922,088 B2 * | 7/2005 | Hilscher | ............ | H03K 19/1732 326/38 |

FOREIGN PATENT DOCUMENTS

JP     2012-120338     6/2012

* cited by examiner

*Primary Examiner* — Bentsu Ro
(74) *Attorney, Agent, or Firm* — Fish & Richardson P.C.

(57) ABSTRACT

The present invention provides a motor driving device without an additional signal line for identifying whether a motor rotates stably. The motor driving device (21) includes a control circuit (100) for receiving an acceleration signal (SU) and a deceleration signal (SD), and generating a driver control signal (S10); a driving circuit (200) for generating a motor driving signal (S3) according to the driver control signal (S10); and a phase-locked identifying circuit (500) for monitoring an input mode of the acceleration signal (SU) and the deceleration signal (SD), and identifying whether the motor rotation speed is stable at the desired target rotation speed.

9 Claims, 6 Drawing Sheets

MOTOR DRIVING DEVICE

BACKGROUND

The present invention relates to a motor driving device.

A phase locked loop (PLL) circuit disposed outside a motor driver IC is configured for perform an application of a phase synchronization control (PLL control) to match the rotation speed of the driver with a desired target rotation speed, and there is a situation that only an acceleration signal and a deceleration signal from the PLL circuit are applied to the motor driver IC (integrated circuit).

In addition, the patent literature 1 is an example relating to the present disclosure.

BACKGROUND TECHNICAL LITERATURE

Patent Literature

[Patent literature 1] Japanese patent laid-open publication No. 2012-120338.

BRIEF SUMMARY OF THE INVENTION

Problems to be Solved in the Present Invention

In this application, in the case that it is to be understood at a motor driver IC side whether a motor stably rotates (for example, whether the rotation speed of the motor achieves the target rotation speed or the rotation speed of the motor deviates the target rotation speed), a phase-locked signal (a signal indicating whether the rotation speed of the motor matches with the target rotation speed) from a PLL circuit is needed to be applied to the motor driver IC.

However, in order to apply a phase-locked signal from a PLL circuit to a motor driver IC, a signal line needs to be added, thus making the number of components increased or an area of a circuit board enlarged. Additionally, depending on specifications of an I/O interface for communicating the PLL circuit with the motor driver IC, additionally adding signal lines may not be allowed in a real situation.

In view of the problems found by inventors of the present application, one of the objectives of the present disclosure is to provide a motor driving device without an additional signal line for identifying whether a motor stably rotates.

Technical Means for Solving Problems

In order to achieve the purpose of the present disclosure, the motor driving device is configured to include a control circuit for receiving an acceleration signal and a deceleration signal and generating a driver control signal; a driving circuit for generating a motor driving signal according to the driver control signal; and a phase-locked identifying circuit for monitoring an input mode of the acceleration signal and the deceleration signal and identifying whether the motor stably rotates at a desired target rotation speed (the first configuration).

In addition, in the first configuration of the motor driving device, it is configured that the phase-locked identifying circuit respectively counts the numbers of successive assertion times of the acceleration signal and the deceleration signal for monitoring the input mode (the second configuration).

Additionally, in the second configuration of the motor driving device, it is configured that when the phase-locked identifying circuit continuously detects the pulse edge of the acceleration signal for "x" times, continuously detects the pulse edge of the deceleration signal for "y" times and then continuously detects the pulse edge of the acceleration signal for "z" times, the phase-locked identifying circuit determines that the rotation speed of the motor achieves the target rotation speed, and switches the phase-locked identifying signal to a logical value indicating the locked phase (the third configuration).

Further, in the third configuration of the motor driving device, it is configured that after the phase-locked identifying circuit determines that the rotation speed of the motor achieves the target rotation speed, the phase-locked identifying circuit switches the phase-locked identifying signal to a logical value indicating the locked phase after predetermined delay time (the fourth configuration).

Further, in the third or fourth configuration of the motor driving device, it is configured that after that the phase-locked identifying circuit determines that the rotation speed of the motor achieves the target rotation speed, the phase-locked identifying signal is switched to a logical value indicating the locked phase after determining that the motor rotation speed signal is stable (the fifth configuration).

Further, in any one of the third to fifth configurations of the motor driving device, it is configured that after the phase-locked identifying circuit switches the phase-locked identifying signal to the logical value indicating the locked phase, when the pulse edge of the acceleration signal or the deceleration signal is continuously detected for "a" times, the phase-locked identifying circuit determines that the motor rotation speed deviates the target rotation speed, and switches the phase-locked identifying signal to a logical value indicating a lock-released phase (the sixth configuration).

Further, the semiconductor device of the present invention is configured to be formed by integrating the motor driving device of any one of the first to sixth configurations (the seventh configuration).

Further, the electronic apparatus of the present invention includes the semiconductor device of the seventh configuration; a digital signal processor for generating a target rotation speed signal; a PLL circuit for generating an acceleration signal and a deceleration signal to the semiconductor device by performing a phase synchronization control of the target rotation speed signal input from the digital signal processor and a motor rotation speed signal input from the semiconductor device; and a motor driven by the semiconductor device (the eighth configuration).

In addition, the electronic apparatus including the eighth configuration further includes a first circuit board for carrying the digital signal processor and the PLL circuit; and a second circuit board for carrying the semiconductor device and the motor (the ninth configuration).

Additionally, the electronic apparatus including the eighth or ninth configuration can be formed, wherein the motor is a sensorless motor (the tenth configuration).

Effects of the Present Invention

If the motor driving device of the present invention is used, there is no need to add a signal line for identifying whether the motor rotates stably.

DETAILED DESCRIPTION

<Electronic Apparatus>

Figure 1:
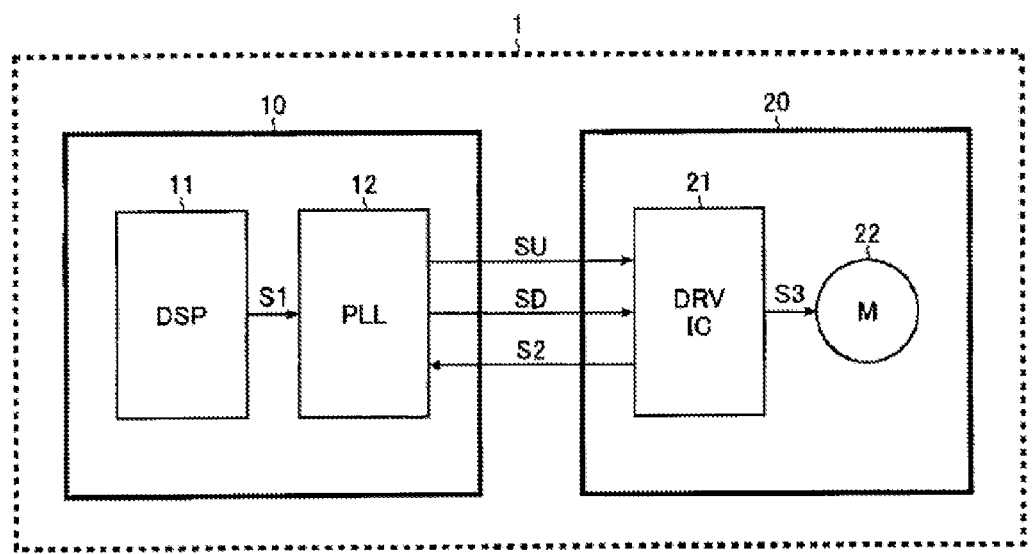
FIG. 1 is a schematic view showing a configuration of an electronic apparatus in accordance with some embodiments.

FIG. 1 is a schematic view showing a configuration of an electronic apparatus. In this embodiment, the electronic apparatus 1 includes a main circuit board 10 and a motor circuit board 20. A digital signal processor (hereafter. DSP) 11 and a PLL circuit 12 are disposed on the main circuit board 10. On the other hand, a motor driver IC 21 and a sensorless motor 22 are disposed on the motor circuit board 20.

The DSP 11 produces a target rotation speed signal S1 (frequency signal) corresponding to a target rotation speed of the sensorless motor 22, and outputs the target rotation speed signal S1 to the PLL circuit 12.

The PLL circuit 12 produces and outputs an acceleration signal SU and a deceleration signal SD to the motor driver IC 12 by performing a phase synchronization control on the target rotation speed S1 input from the DSP 11 and a motor rotation speed signal S2 (referred as a frequency signal of a frequency generator (FG) signal) input from the motor driver IC 21. Specifically, the PLL circuit 12 generates a pulse of the acceleration signal SU while the frequency of the motor rotation speed signal S2 is less than the frequency of the target rotation speed signal S1 (the motor rotation speed is lower than the target rotation speed), and generates a pulse of the deceleration signal SD while the frequency of the motor rotation speed signal S2 is higher than the target rotation speed S1 (the motor rotation speed is higher than the target rotation speed).

The motor driver IC 21 is a semiconductor device integrating a motor driving device of a driving control main body of the sensorless motor 22. The motor driver IC 21 produces a motor driving signal S3 according to the acceleration signal SU and the deceleration signal SD input from the PLL circuit 12, and performs a driving control of the sensorless motor 22 by using the motor driving signal S3. Further, the motor driver IC 21 produces the motor rotation speed signal S2 corresponding to the motor rotation speed of the sensorless motor 22 by detecting voltage induced in the motor coil, and outputs the motor rotation speed signal S2 to the PLL circuit 12.

The sensorless motor 22 is driven by the motor driving signal S3 input from the motor driver IC 21. Due to the fact that no Hall element presents in the sensorless motor 22, it is advantageous for hardware miniaturization or cost reduction.

<Motor Driver IC>

Figure 2:
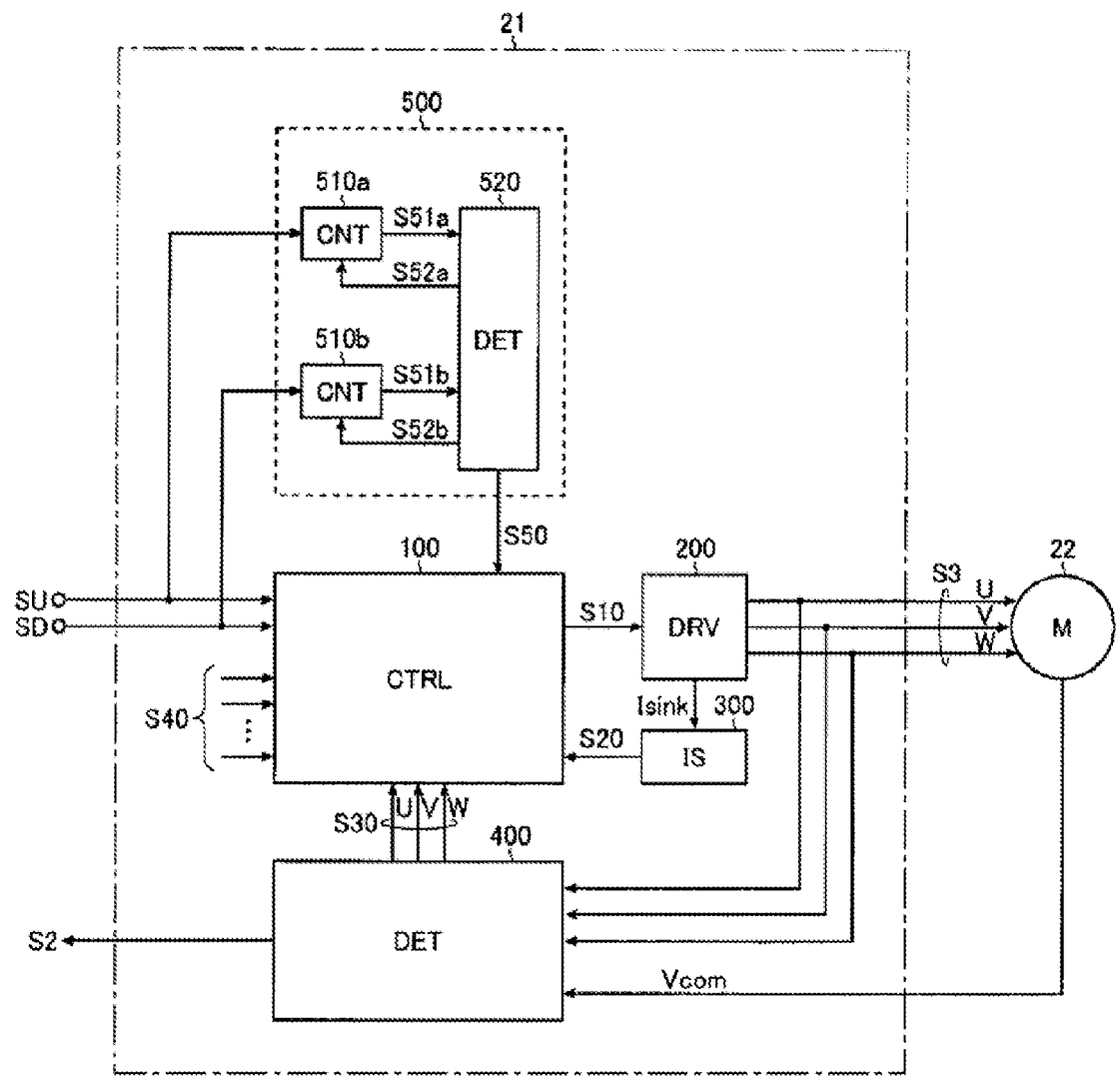
FIG. 2 is a schematic view showing a motor driver IC in accordance with an embodiment of the present disclosure.

FIG. 2 is a schematic view showing the motor driver IC 21. In the motor driver IC 21 of the embodiment, a control circuit 100, a driving circuit 200, an initial location detecting circuit 300, a rotation detecting circuit 400 and a phase-locked identifying circuit 500 are integrated in a circuit block for forming a motor driving device.

The control circuit 100 receives the input of the acceleration signal SU and the deceleration signal SD for generating a diver control signal S10. Specifically, the control signal 100 generates the driver control signal S10 by the following methods: receiving the pulse of the acceleration signal SU and increasing the motor rotation speed when receiving the pulse of the acceleration signal SU; and reducing the motor rotation speed when receiving the deceleration signal SD. Additionally, the control circuit 100 receives the input of an initial location detecting signal S20 or a zero crossing signal S30 (or motor rotation speed signal S2), so as to perform an activation operation or a rectification operation of the sensorless motor 22. Further, in addition to receiving the signals, the control circuit 100 receives various control signals S40 (a temperature protection signal or a voltage reduction protection signal), and generates the driver control signal S10 in response to the content of these signals.

Further, the control circuit 100 includes the following functions: switching modes (for example, an acceleration mode and a constant speed mode) according to a phase-locked identifying signal S50 input from the phase-locked identifying circuit 500. In the case that the function of switching modes is embedded, it must be precisely identified that whether the sensorless motor 22 stably rotates (for example, the timing of the motor rotation speed achieves the target rotation speed or the motor rotation speed deviates the target rotation speed), in order to avoid improper driving such as asynchronous driving.

The driving circuit 200 generates motor driving signals S3 with three phases (U, V, W) according to the driver control signal S10 input from the control circuit 100, and outputs the motor driving signals S3 to a motor coil of each phase of the sensorless motor 22.

When the sensorless motor 22 is activated, the initial location detecting circuit 300 detects the initial location of the sensorless motor 22 (an initial phase of a rotor), and generates the initial location detecting signal 520 which indicates the detection result. In addition, the method for detecting the initial location of the sensorless motor 22 may use inductive sensing, for example. When each phase path (U→V, U→W, V→U, V→W, W→U, W→V, 6 modes) of the stopped sensorless motor 22 is respectively supplied with test current, the initial location detecting circuit 300 sorts the current flowing into each phase path, and detects the initial location of the sensorless motor 22 bases on the sorting result. Further, the sink current kink flowing into the driving circuit 200 can be detected as the current flowing into each phase path. In addition, like the normal driving of the sensorless motor 22, the supply of the test current is performed by using the control circuit 100 and the driving circuit 200. Further, in order to prevent the sensorless motor 22 from being rotating due to the test current, it is desired that the current value of the test current is less than the current value during the normal driving. Moreover, it is preferred that the supply period of the test current is shorter than the supply period of the normal driving.

The rotation detecting circuit 400 respectively detects the zero crossing timing (the consistent timing of the induced voltage of each phase and the neutral voltage Vcom) of the voltage induced in the motor coil of each phase, and generates the zero crossing signal S3 of each phase (U, V, W). Further, during the detection of the zero crossing timing, each phase output of the driving circuit 200 is set as a high impedance status to facilitate the observation of the voltage induced in the motor coil.

Further, the rotation detecting circuit 400 generates a motor rotation speed signal S2 according to the zero crossing signal S30 of each phase (U, V, W), and outputs the motor rotation speed signal S2 to the PLL circuit 12. In addition, the zero crossing signal S30 of any phase (for example, the phase U) can be selected to be output as the motor rotation speed signal S2, or the zero crossing signal S30 of any phase (U, V, W) can be synthesized to produce the motor rotation speed signal S2.

The phase-locked identifying circuit 500 is shown as the following circuit block of: monitoring the input mode of the acceleration signal SU and the deceleration signal SD for identifying whether the motor rotation speed is stably kept at the desired target rotation speed, and outputting the determination result as the phase-locked identifying signal S50 to the control circuit 100. The phase-locked identifying circuit 500 includes counting portions 510a and 510b, and an identifying portion 520.

The counting portion 510a counts the successive assertion times of the acceleration signal SU, and outputs the counting result as a counter signal S51a to the identifying portion 520. For example, when the pulse edge of acceleration signal SU is continuously detected by the counting portion 510a for a certain times reaching the predetermined threshold times (the following mentioned "x", "z" or "a" times), the counter signal S51a is switched from a low voltage level to a high voltage level. Further, the switch control of the predetermined threshold times and the reset control of the counter signal S51a are both performed according to the control signal S52a input from the identifying portion 520.

The counting portion 510b counts the successive assertion times of the deceleration signal SD, and outputs the counting result as a counter signal S51b to the identifying portion 520. For example, when the pulse edge of deceleration signal SD is continuously detected by the counting portion S10b for a certain times reaching the predetermined threshold times (the following mentioned "y" or "a" times), the counter signal S51b is switched from a low voltage level to a high voltage level. Further, the switch control of the predetermined threshold times and the reset control of the counter signal S51b are both performed according to the control signal S52b input from the identifying portion 520.

Therefore, the phase-identifying circuit 500 is formed as the configuration for: respectively counting the successive assertion times of the acceleration signal SU and the successive assertion times of the deceleration signal SD in order to monitor the input mode of the acceleration signal SU and the deceleration signal SD.

The identifying portion 520 receives the counter signals S51a and S51b to monitor the input mode of the acceleration signal SU and the deceleration signal SD, and identifies whether the motor rotation speed is stably kept at the target rotation speed based on whether the input mode meets the predetermined phase-locked identification mode (described in detail in the following descriptions). Further, the phase-locked identifying signal S50 generated by the identifying portion 520 becomes, for example, a high voltage level (a logic level at the locked phase) when the motor rotation speed is stably kept at the target rotation speed, and becomes a low level (a logical level at the lock-released phase) when the motor rotation speed deviates the target rotation speed.

The motor driver IC 21 of this embodiment can identify whether the sensorless motor 22 stably rotates by means of monitoring the acceleration signal SU and the deceleration signal SD instead of receiving the phase-locked signal from the PLL circuit 12. As such, there is no need to employ extra components or to employ a larger circuit board due to adding extra signal lines.

Further, it is not required to change the specification of the interface between the main circuit board 10 and the motor circuit board 20 when using the motor driver IC 21 of this embodiment. As a consequence, the motor driver IC 21 is easy to comply with the current system.

Additionally, in the motor driver IC 21 of this embodiment, to facilitate the description, the phase-locked identifying circuit 500 includes a plurality of hardware components (counting portions 510a and 510b, and identifying portion 520), but the phase-locked identifying circuit 500 is not limited thereto. In some embodiments, the phase-locked identifying circuit 500 may be a software-based architecture combined with a DSP circuit.

<Phase-Locked Identification>

Figure 3:
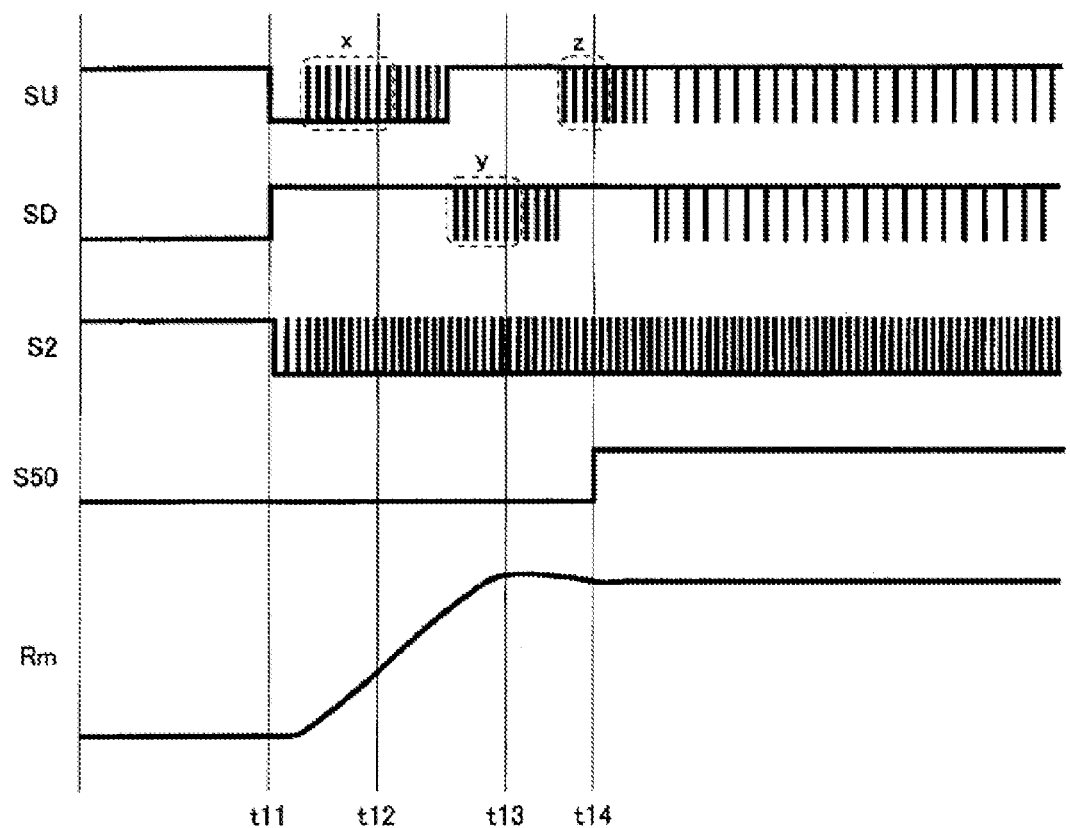
FIG. 3 is a timing diagram showing the phase-locked identification in accordance with a first embodiment of the present disclosure.

FIG. 3 is a timing diagram showing the phase-locked identification according to a first embodiment of the present disclosure. An acceleration signal SU, a deceleration signal SD, a motor rotation speed signal S2, a phase-locked identifying signal S50 and a motor rotation speed Rm are illustrated in sequence from top to bottom in the timing diagram.

As mentioned above, the phase-locked identifying circuit 500 (more specifically, the identifying portion 520) identifies whether the motor rotation speed is stably kept at the target rotation speed based on whether the input mode of the acceleration signal SU and the deceleration signal SD meet the predetermined phase-locked identification mode, and switches the logical value of the phase-locked identifying signal S50.

The concept of the disclosure is based on the fact that after the sensorless motor 22 starts being driven and before the motor rotation speed Rm achieves and stably keeps at the target rotation, (1) successive assertion of the acceleration signal SU (the initial acceleration duration), (2) successive assertion of the deceleration signal SD (the deceleration duration of the motor rotation speed Rm), and (3) successive assertion of the acceleration signal SU (the re-acceleration duration of the motor rotation speed Rm) are shown in sequence.

In combination with the specific descriptions of this figure, after the phase-locked identifying circuit 500 starts driving the sensorless motor 22 at time t11, it is identified that the motor rotation speed Rm achieves the target rotation speed and the phase-locked identifying signal S50 is switch to a high voltage level (a logic level at the locked phase) when the pulse edge of the acceleration signal SU is continuously detected for "x" times (e.g., x=5) at time t12, the pulse edge of the deceleration signal SD is continuously detected for "y" times (e.g., y=3) at time t13, and the pulse edge of the acceleration signal SU is continuously detected for "z" times at time t14 (e.g., z=1) high voltage level. In addition, among the successive assertion times ("x" times, "y" times, "z" times), x, y, z≥1 is established, and in this specification, it is not allowed to present "successive one time", which is unnatural expression.

By performing this phase-locked identification, the phase-locked timing (the timing that the motor rotation speed Rm achieves the target rotation speed) can be precisely and easily understood at the motor driver IC 21 side, and thus the switch of the action mode can be properly controlled by using the control circuit 100.

In addition, for the successive assertion times ("x", "y", "z" times) of the acceleration signal SU and the deceleration signal SD, it is preferred to store the successive assertion times in any data rewritable non-volatile memory outside the motor driver IC 21. In this configuration, the phase-locked identification mode can be optimized according to the characteristics of the sensorless motor 22.

Further, for the phase-locked identification mode, variations can be made according to the characteristics of the sensorless motor 22. For example, after the successive assertion of (1) to (3), when the successive assertion of the deceleration signal SD is detected, the locked phase is identified. Moreover, for example, only the successive assertion times of the acceleration signal SU are monitored by the phase-locked identifying circuit 500, and at when the number of times is decreased from x (for example, 5) to z (for example, 1), the locked phase is identified.

Figure 4:
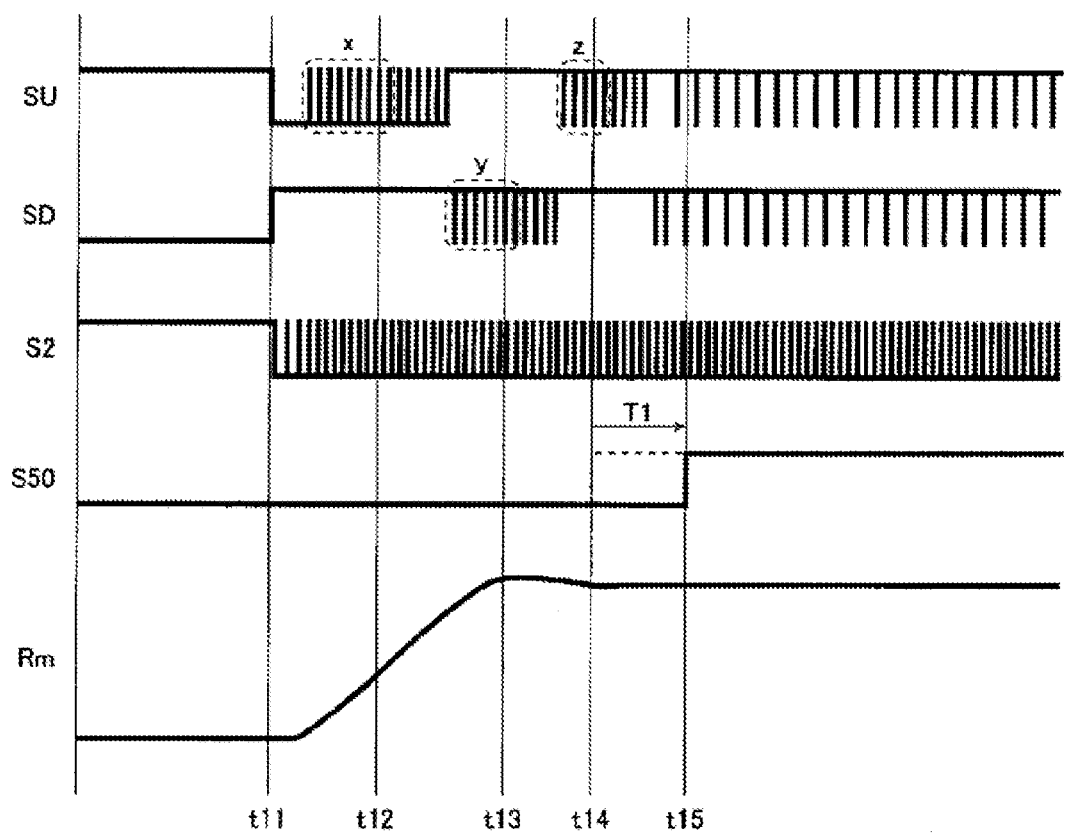
FIG. 4 is a timing diagram showing the phase-locked identification in accordance with a second embodiment of the present disclosure.

FIG. 4 is a timing diagram showing the phase-locked identification according to a second embodiment of the present disclosure. Like FIG. 3, an acceleration signal SU, a deceleration signal SD, a motor rotation speed signal S2, a phase-locked identifying signal S50 and a motor rotation speed Rm are illustrated in sequence from top to bottom.

In the second example shown in this figure, nearly the same to the first embodiment (FIG. 3), after the predetermined delay time T1 from the phase-locked identifying circuit 500 identifies that the motor rotation speed Rm achieves the target rotation speed at time t14, the phase-locked identifying signal S50 is switched to a high voltage level (a logical value indicating the locked phase) at time t15. In this way, after the motor rotation speed Rm is sufficiently stable, the phase-locked identifying signal S50 can be increased to a high voltage level, such that the reliability of the phase-locked identifying signal S50 can be further improved.

Figure 5:
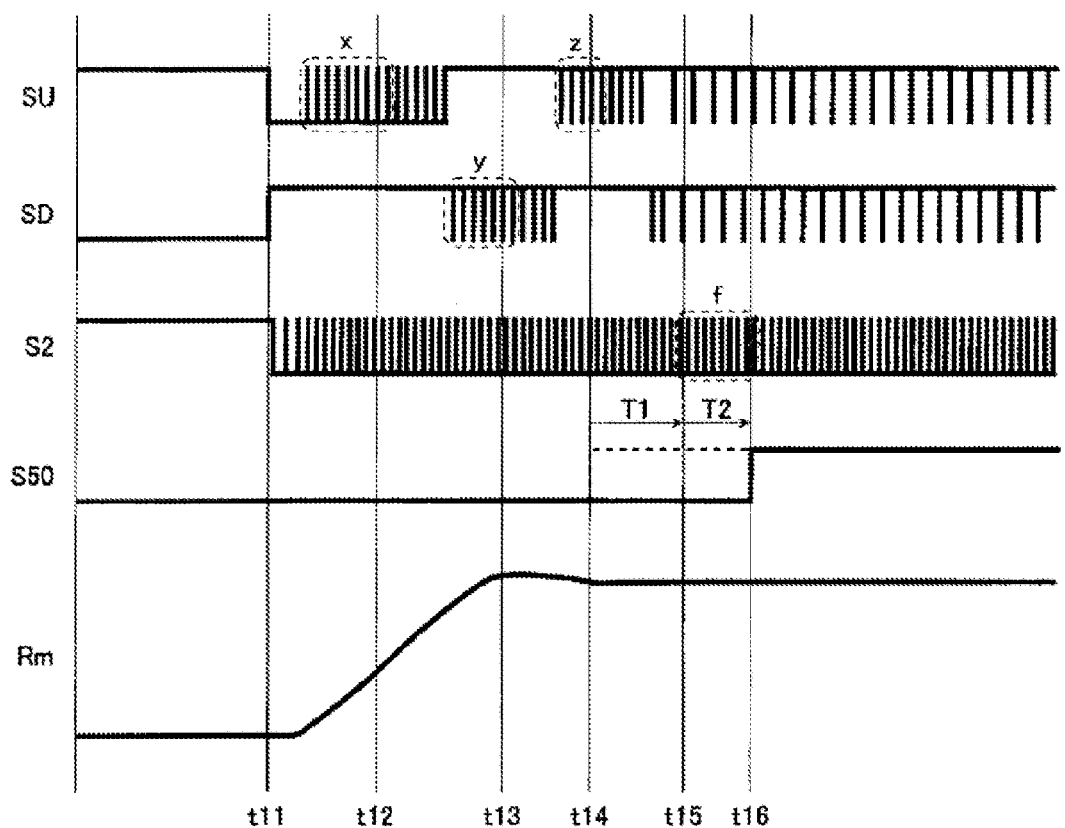
FIG. 5 is a timing diagram showing the phase-locked identification in accordance with a third embodiment of the present disclosure.

FIG. 5 is a timing diagram showing the phase-locked identification according to a third embodiment of the present disclosure. Like FIGS. 3 and 4, an acceleration signal SU, a deceleration signal SD, a motor rotation speed signal S2, a phase-locked identifying signal S50 and a motor rotation speed Rm are illustrated in sequence from top to bottom.

The third embodiment shown in this figure is nearly the same with the second embodiment (FIG. 4), after the predetermined delay time T1 from the phase-locked identifying circuit 500 identifies that the motor rotation speed Rm achieves the target rotation speed at time t14, the motor rotation speed signal S2 is stable (e.g. the deviation of the pulse frequency f of the motor rotation speed signal S2 is less than a predefined range) and the phase-locked identifying signal S50 is switched to a high voltage level (a logical value indicating the locked phase) at time t15. In this way, after determining the motor rotation speed Rm is stable by various aspects, the phase-locked identifying signal S50 can be increased to a high voltage level, such that the reliability of the phase-locked identifying signal S50 can be further improved.

<Lock-Released Phase>

Figure 6:
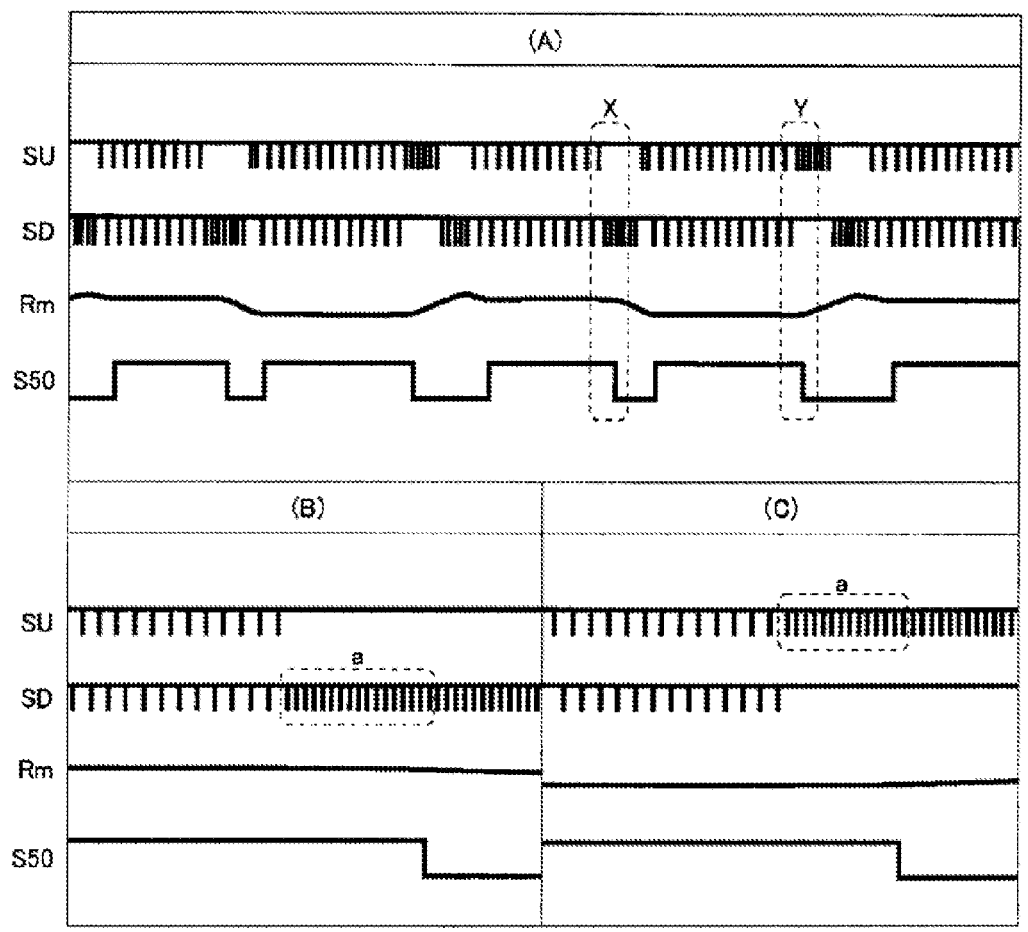
FIG. 6 is a timing diagram showing the lock-released phase identification in accordance with an embodiment of the present disclosure.

FIG. 6 is a timing showing the lock-released phase identification according to an embodiment of the present disclosure. Further, in columns (A) to (C) of FIG. 6, an acceleration signal SU, a deceleration signal SD, a motor rotation speed Rm and a phase-locked identifying signal S50 are illustrated in sequence from top. In addition, in columns (B) and (C) of FIG. 6, the section X and the section Y of the column (A) are partially enlarged and illustrated.

When the motor rotation speed Rm achieves the target rotation speed and stays stable, the phase-locked identifying circuit 500 switches the phase-locked identifying signal S50 to a high voltage level (a logical value indicating the phase locking). On the other hand, when the motor rotation speed Rm deviates the target rotation speed, the phase-locked identifying circuit 500 switches the phase-locked identifying signal S50 to a low voltage level (a logical value indicating the lock-released phase).

Additionally, during the lock-released phase identification, the phase-locked identifying circuit 500 also monitors the input mode of the acceleration signal SU and the deceleration signal SD. It means that when the input mode of the acceleration signal SU and the deceleration signal SD meets the mode of the lock-released phase identification, the phase-locked identifying circuit 500 switches the phase-locked identifying signal S50 to a low voltage level.

Herein, a regular pattern is found that when the motor rotation speed Rm deviates the target rotation speed, the acceleration signal SU or the deceleration signal SD asserts successively, and thus utilizing the regular pattern to identify the lock-released phase.

For example, when the motor rotation speed Rm is stable (S50=H), in the situation that it is intended to lower the target rotation speed, in order to lower the motor rotation speed Rm to the new target rotation speed, the deceleration speed SD is successively asserted (referring to the section X of the column (A) and the column (B) of this figure). Further, in the situation that the target rotation speed is constant and the motor rotation speed Rm is unexpectedly increased, in order to lower the motor rotation speed Rm to the target rotation speed, the deceleration signal SD is successively asserted.

On the contrary, when the motor rotation speed Rm is stable (S50=H), in the situation that it is intended to increase the target rotation speed, in order to increase the motor rotation speed Rm to the new target rotation speed, the acceleration signal SU is successively asserted (referring to the section Y of the column (A) and the column (C) of this figure), Further, in the situation that the target rotation speed is constant and the motor rotation speed Rm is unexpectedly decreased, in order to increase the motor rotation speed Rm to the target rotation speed, the acceleration signal SU is successively asserted.

Hence, after the phase-locked identifying circuit 500 switches the phase-locked identifying signal S50 to a high voltage level (a logical value indicating the locked phase), when the pulse edge of the acceleration signal SU or the deceleration signal SD is successively detected for "a" times (for example, 5 times), it is identified that the motor rotation speed Rm deviates the target rotation speed, and the phase-locked identifying signal S50 is switched to a low voltage level (a logical value indicating the lock-released phase).

By performing this lock-released phase identification, the timing of the lock-released phase (the timing of the motor rotation speed Rm deviating the target rotation speed) can be easily and accurately understood at the motor driver IC 21 side, such that the switch control of the action mode can be properly carried out by using the control circuit 100.

In addition, for the successive assertion times ("a" times) of the acceleration signal SU and the deceleration signal SD, it is desired to be stored in any data rewritable non-volatile memory outside the motor driver IC 21. In this way, the mode of the lock-released phase identification can be optimized according to the characteristics of the sensorless motor 22.

Further, in the situation that it is intended to increase/lower the target the target rotation speed, it is feasible to perform variable control of the successive assertion times ("a") by increasing the successive assertion times ("a")

when a difference between the current target rotation speed and the changed target rotation speed.

Moreover, in the situation that the phase-locked identification is re-performed after the lock-released phase, the mode of the phase-locked identification (referring to FIG. 3 to FIG. 5) applied at the activation of the motor can be directly used, or additional modes of the phase-locked identification other than that applied at the activation of the motor can be prepared.

Additionally, unlike the case that the motor rotation speed Rm needs to be increased immediately from zero to the target rotation speed at the activation of the motor, after the activation of the motor, when the motor rotation speed Rm deviating the target rotation speed is increased or decreased to re-meet the target rotation speed, no such large over-modulation or negative-modulation of the motor rotation speed Rm would be produced. In view of such situation, after the identification of the lock-released phase, the phase-locked identification can be re-made at the time point at which the acceleration signal SU or the deceleration signal SD is successively input for "b" times (for example, 1 time).

<Other Variations>

In addition to the disclosed embodiments, each technical feature disclosed in the specification of the present application can be applied with various modifications without departing the spirit of the present disclosure. In other words, it should be considered that the disclosed embodiments are exemplary and have no limitations, and it should be understood that the technical scope of the present invention is defined by claims rather than the disclosed embodiments, and includes equivalents of claims and all modifications within the scope.

INDUSTRIAL APPLICABILITY

The present invention can be used in all electronic apparatus including motors.

What is claimed is:

1. A motor driving device, comprising:
   a control circuit for receiving an acceleration signal and a deceleration signal, and generating a driver control signal;
   a driving circuit for generating a motor driving signal according to the driver control signal; and
   a phase-locked identifying circuit for monitoring an input mode of the acceleration signal and the deceleration signal, and identifying whether a motor rotation speed is stable at a desired target rotation speed,
   wherein in order to monitor the input mode, the phase-locked identifying circuit respectively counts a number of successive assertion times of the acceleration signal and a number of successive assertion times of the deceleration signal.

2. The motor driving device of claim 1, wherein after the phase-locked identifying circuit continuously detects a pulse edge of the acceleration signal for "x" times, continuously detects a pulse edge of the deceleration signal for "y" times and then continuously detects the pulse edge of the acceleration signal for "z" times, the phase-locked identifying circuit determines that the motor rotation speed achieves the target rotation speed, and the phase-locked identifying signal is switched to a logical value indicating a locked phase.

3. The motor driving device of claim 2, wherein after the phase-locked identifying circuit determines that the motor rotation speed achieves the target rotation speed, the phase-locked identifying signal is switched to the logical value indicating the locked phase after predetermined delay time.

4. The motor driving device of claim 2, wherein after the phase-locked identifying circuit determines that the motor rotation speed achieves the target rotation speed, the phase-locked identifying signal is switched to the logical value indicating the locked phase after it is determined that a motor rotation speed signal is stable.

5. The motor driving device of claim 2, wherein after the phase-locked identifying circuit switches the phase-locked identifying signal to the logical value indicating the locked phase, when the pulse edge of the acceleration signal or the deceleration signal is continuously detected for "a" times, the phase-locked identifying circuit determines that the motor rotation speed deviates the target rotation speed, and switches the phase-locked identifying signal to a logical value indicating a lock-released phase.

6. A semiconductor device, comprising the motor driving device of claim 1.

7. An electronic apparatus, comprising:
   the semiconductor device of claim 6;
   a digital signal processor for generating a target rotation speed signal;
   a PLL (phase locked loop) circuit for generating an acceleration signal and a deceleration signal to the semiconductor device by performing a phase synchronization control of the target rotation speed signal input from the digital signal processor and a motor rotation speed signal input from the semiconductor device; and
   a motor driven by the semiconductor device.

8. The electronic apparatus of claim 7, further comprising:
   a first circuit board for carrying the digital signal processor and the PLL circuit; and
   a second circuit board for carrying the semiconductor device and the motor.

9. The electronic apparatus of claim 7, wherein the motor is a sensorless motor.

* * * * *